United States Patent [19]

Edwards

[11] Patent Number: 5,416,722
[45] Date of Patent: May 16, 1995

[54] SYSTEM AND METHOD FOR COMPACTING INTEGRATED CIRCUIT LAYOUTS

[75] Inventor: Lawrence B. Edwards, San Jose, Calif.

[73] Assignee: VLSI Technology, Inc., San Jose, Calif.

[21] Appl. No.: 978,558

[22] Filed: Nov. 19, 1992

[51] Int. Cl.⁶ .......................................... G06F 15/60
[52] U.S. Cl. .................................. 364/491; 364/489; 364/488; 364/490
[58] Field of Search ................. 364/488, 489, 490, 491

[56] References Cited

U.S. PATENT DOCUMENTS

| | | | |
|---|---|---|---|
| 5,097,422 | 3/1992 | Corbin, II et al. | 364/491 |
| 5,267,177 | 11/1993 | Sato et al. | 364/491 |
| 5,281,558 | 1/1994 | Bamji et al. | 364/491 |
| 5,309,371 | 5/1994 | Shikata et al. | 364/491 |
| 5,315,534 | 5/1994 | Schlachet | 364/490 |

OTHER PUBLICATIONS

"Compaction Based Custom LSI Layout Design Method" by Ishikawa et al., IEEE Computer Society Press, 1985, pp. 343-345.

*Primary Examiner*—Vincent N. Trans
*Attorney, Agent, or Firm*—Flehr, Hohbach, Test, Albritton & Herbert

[57] ABSTRACT

A computer aided design process for compacting semiconductor circuit layouts to meet a specified set of design rules begins by fracturing a specified circuit layout into a maximal set of trapezoids and storing the resulting trapezoidal cells in a database that denotes the boundaries of each cell, and the cell adjacent to each boundary. Empty spaces between cells are represented by additional cells. For each cell boundary, the database also stores data representing the boundary edge's end points. Neighboring cells on the same and related layers of the circuit layout share edges in the database. When an edge of a cell is moved, the shared edge of each neighboring cell is implicitly moved because it uses the same edge data. To adjust a circuit layout, the cells in the layout are processed in sorted order. For each cell, a set of width and spacing design rules are applied to the bottom and top edges of the cell which may result in movement of the cell and adjustment of the cell's width. An adjacent cell adjustment process conforms adjacent cells to the boundary movements of other cells. The compaction process is performed once for X-direction compaction and once for Y-direction compaction. The compaction process is computationally efficient because each cell is linked by the database to its adjacent cells, virtually eliminating the need to search through cells not needed for each design rule check, and because movement of one cell's edges automatically adjusts adjacent cells via their shared edges.

8 Claims, 8 Drawing Sheets

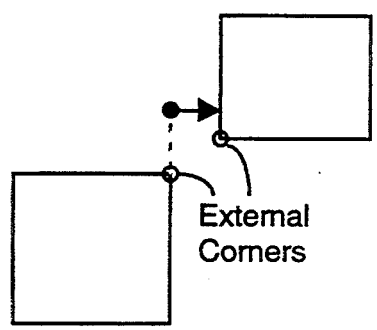
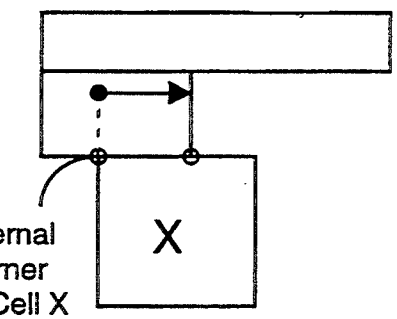
FIGURE 10A  FIGURE 10B
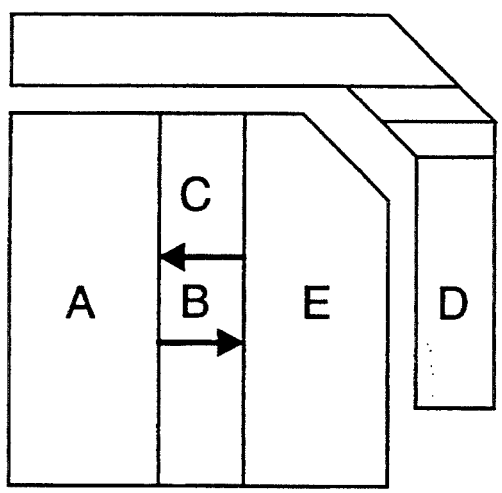  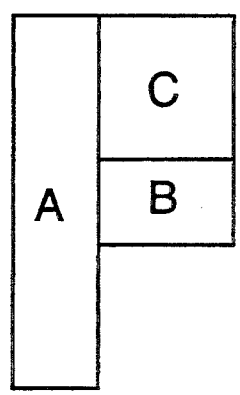
FIGURE 11A  FIGURE 11B
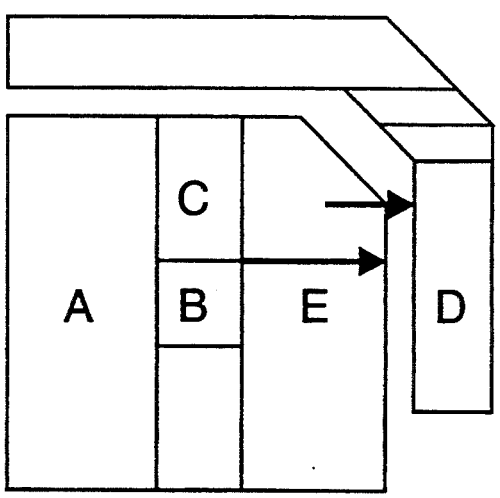  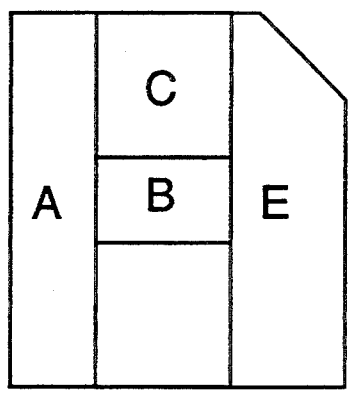
FIGURE 12A  FIGURE 12B

SYSTEM AND METHOD FOR COMPACTING INTEGRATED CIRCUIT LAYOUTS

The present invention relates generally to computer aided design systems which facilitate the design of integrated circuits and particularly to computer aided design methods and systems for automatically compacting integrated circuit layouts so as to meet a different set of "design rules" than the design rules originally used for a specified circuit layout.

BACKGROUND OF THE INVENTION

Virtually all complex integrated circuits are designed with the use of computer aided design (CAD) tools. Some CAD tools, called simulators, help the circuit designer verify the operation of a proposed circuit. Another type of CAD tool, called a silicon compiler (also sometimes known as automatic layout or place and route systems), generates the semiconductor mask patterns from a detailed circuit specification. These semiconductor mask patterns for a particular circuit are commonly called the "circuit layout".

Circuit layouts have multiple overlapping mask layers for defining different mask levels (also called layout levels) of a semiconductor integrated circuit. For instance, some layers of the circuit layout will define the regions of the semiconductor substrate that are doped with N-type or P-type dopants, while other layers of the circuit layout will define regions in which materials are deposited on the top of the substrate, such as polysilicon and metal regions, while yet other layers will define apertures to be formed in various layers of material so as to form connections between layers of the semiconductor circuit.

Each layer of a circuit layout is defined as a set of polygons or cells. In some systems, the cells must be rectangles, but most circuit layout systems allow the use of trapezoids and/or polygons whose sides are all vertical, horizontal or at a 45 degree angle to such vertical and horizontal sides.

Typically, a circuit layout will be prepared for a particular set of design rules. For instance, one will often hear that a circuit was manufactured using "2 micron design rules" or "2 micro minimum critical dimensions". Such phrases mean that certain features of the circuit's layout have minimum widths of 2 microns. Later, a faster version of that same circuit may be manufactured using "1 micron design rules" or "1 micron minimum critical dimensions".

While a number of attempts have been made in the past to compress or compact circuit layouts using automated computer techniques, most such prior automatic circuit layout compression systems use graph theory or linear programming methods, and thus lose at least some of the useful information and optimizations in the original layout. In addition, many of the prior art techniques are unable to handle layouts that include polygons with sides at 45 degree angles, and most require so many computer operations as to be impractical commercially.

SUMMARY OF THE INVENTION

A computer aided design system for compacting semiconductor circuit layouts to meet a specified set of design rules. The specified set of design rules may cause the circuit layout to be compressed or expanded, depending on differences between the design rules used for the original circuit layout and the design rules used during the compacting process.

The automated circuit layout compacting process begins by fracturing a specified circuit layout into a maximal set of trapezoids and then storing the resulting trapezoids in a database, herein called the connectivity data structure, that denotes the boundaries of each trapezoid cell, and the cell adjacent to each such boundary. Empty spaces between cells are represented by additional empty cells. For each cell boundary, the connectivity data structure also stores data representing the beginning and end points of each boundary edge (line segment), as well as move data representing the distance by which each such edge has been moved. Neighboring cells on the same and related layers of the circuit layout share edges in the connectivity data structure, and edges share common points. As a result, when an edge or point of a cell is moved, the shared edge or point of each neighboring cell is implicitly moved because it uses the same point data.

Design rules are specified as Width rules and Spacing rules. Width rules concern the minimum widths of circuit structures and minimum overlaps of circuit structures. For instance, a design rule could require that each polysilicon to diffusion contact be overlapped by polysilicon on all sides by at least X microns. Spacing rules concern minimum spacing between disjoint cells such as the space between two metal lines (metal to metal spacing).

To adjust a circuit layout, a sorted list of the cells in the layout is generated and then the cells are processed in sorted order. When compacting the circuit layout in the X dimension, the cells are sorted based on the leftmost point of each cell. To process a cell, the specified set of width and spacing design rules are applied to bottom edges of the cell, which may result movement of the cell and adjustment of the cell's width. Then the specified set of width and spacing design rules are applied to top edges of the cell, which may result in further movement of the cell and adjustment of the cell's width. Next, the edges of adjacent cells that were previously moved (i.e., earlier cells in the sorted list of cells) are adjusted, if necessary, so that all bottom edges of each affected cell have the same move distance, and so that all top edges of each affected cell have the same move distance. If a top edge is moved by the adjacent-cell-adjustment process, then the movement of the top edge is propagated to all cells in the shadow (with smaller values of the dimension in which the layout is being compacted) of the adjusted top edge. Furthermore, for all adjacent cells that are adjusted, the adjacent-cell-adjustment process is performed recursively until all previously processed cells have been adjusted. This process is repeated for all the non-empty cells in the layout.

Then, after flipping the coordinate values for the axis along which compression is being performed (e.g. setting all X coordinate values to −X), the above compacting process is repeated for all non-empty cells in the layout, skipping the spacing design rules but applying the width design rules a second time to minimize feature widths. Finally, the edges are moved by the previously assigned move distances, and the circuit layout is regenerated.

The compaction process must be performed once for X-direction compaction and once for Y-direction compaction. The compaction process of the invention is computationally efficient because each cell is linked by the connectivity data structure to its adjacent cells. As a result, the number of cells accessed to perform each design rule check is limited because the cells adjacent the top and bottom edges of the cell to which the design rules are applied can be accessed directly without having to search through and check unrelated cells.

BRIEF DESCRIPTION OF THE DRAWINGS

Additional objects and features of the invention will be more readily apparent from the following detailed description and appended claims when taken in conjunction with the drawings, in which:

FIG. 10A shows how spacing design rules are applied to a circuit layout during "overscan" steps, which extend design rule checks to diagonal distances. FIG. 10B shows how width design rules are applied to a circuit layout during overscan steps. As shown the ray tracing process is started at an offset point to find a cell boundary. Then the compaction process will compute the distance between the two cell boundaries and will move the boundary currently being checked, if necessary, to meet the requirements of the design rule.

FIGS. 11A–11B, 12A–12B and 13A–13B represent the circuit layout of FIG. 9A at successive stages of the layout compaction process of the present invention.

DESCRIPTION OF THE PREFERRED EMBODIMENTS

Figure 1:
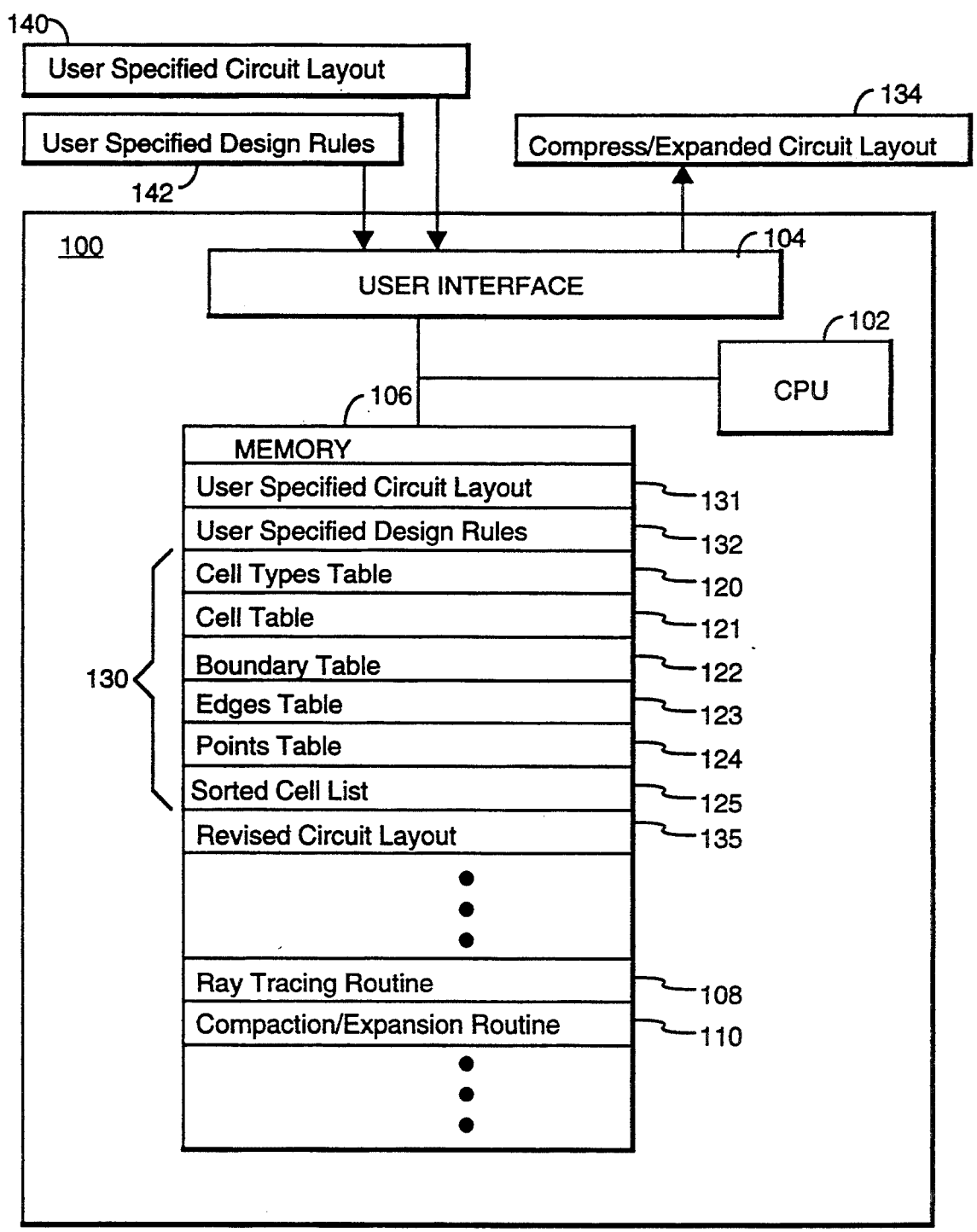
FIG. 1 is a block diagram of a computer aided circuit design system.

Referring to FIG. 1, the preferred embodiment is implemented on a computer workstation 100 having a CPU 102, a user interface 104, disk or other memory storage 106 for storing software routines 108, 110 and for storing arrays of circuit layout data 120–125, collectively called the connectivity data structure 130 or the circuit layout database. Data such as an initial user specified circuit layout 140 and specified design rules 142 to be used in the layout compaction process the netlist may be entered through the user interface 104 and are stored in data arrays 131, 132. Array 132 is sometimes called the design rule dictionary. The revised circuit layout 134 generated by the computer 100 is initially stored in data array 135 (during layout generation) and is transmitted via the user interface 104 for storage on a tape or disk or is transmitted to mask generator (not shown).

The software modules stored in memory 106 include a "Ray Tracing" routine 108 and a compaction routine 110.

Connectivity Data Structure

Figure 2:
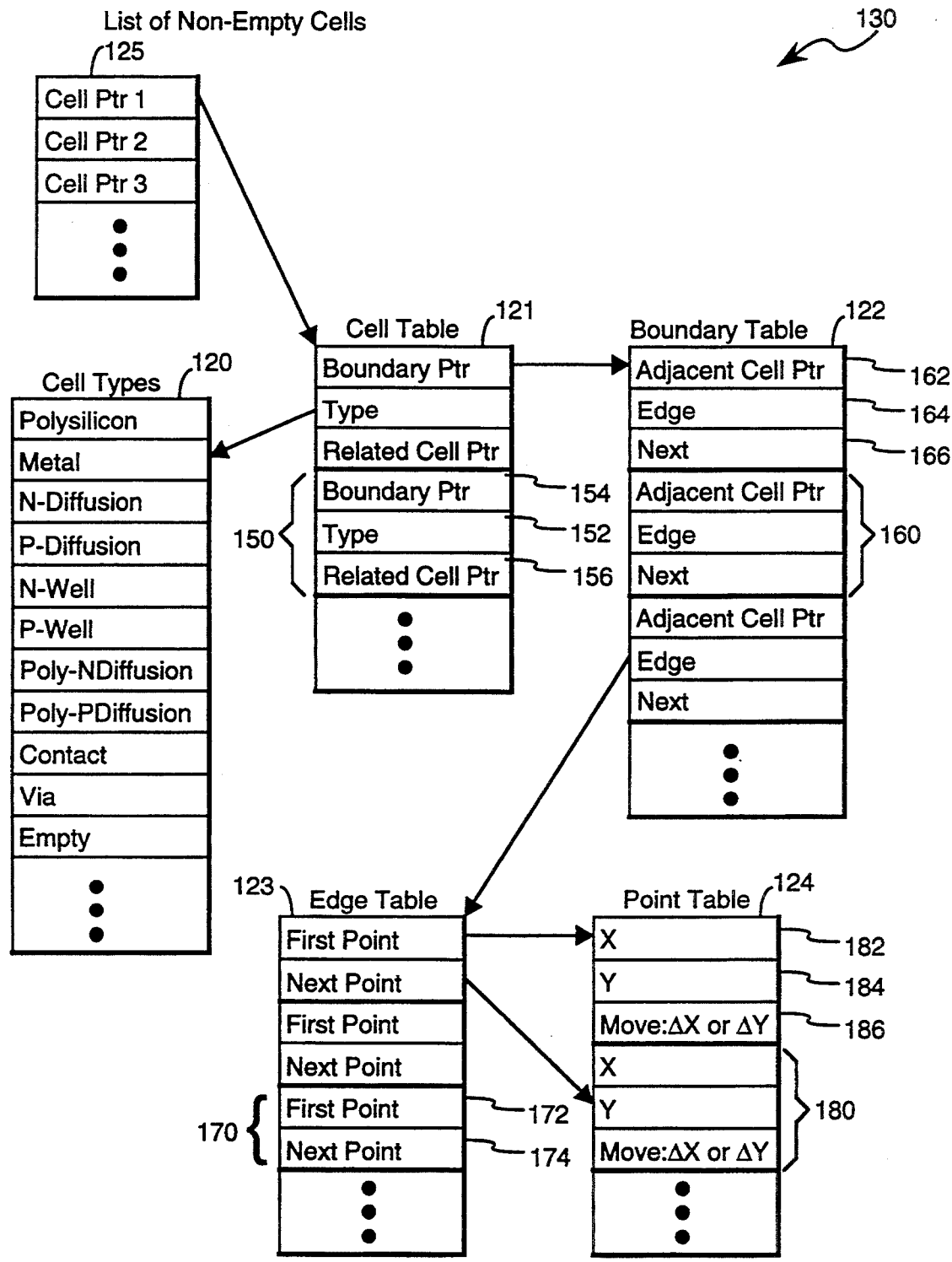
FIG. 2 is a block diagram of the connectivity data structure used to represent a circuit layout in accordance with the present invention.

FIG. 2 shows the logical relationships between the components of the connectivity data structure 130. The cell types table 120 lists the different cell types used in the cell representation of the specified circuit layout. The cell types include the traditional layout layers, plus certain "combination" layers such as "Poly-N-diffusion" that represent functionally important overlapping circuit features (such as the transistor channel region defined by polysilicon overlapping a diffusion region), as well as an "empty" cell type that is used to represent the empty spaces in a circuit layout. As will be explained below, the "empty" cells in the connectivity data structure are not assigned a layout level because the connectivity data structure provides a pointer to each other cell that is adjacent to a first cell. Thus, the layout level of empty cells is implied by the cells to which it is adjacent.

The cell table 121 contains one entry 150 for each polygon, herein called a cell, in the specified circuit layout. Each cell entry 160 has a specified type 152 (one of the types listed in cell type table 120) and a boundary pointer 154 to a linked list of boundary items 160 in the boundary table 122. Each cell 150 also has a slot for storing a "related cell pointer", which points to a cell (called a related cell) in a neighboring layer of the circuit. Examples of related cell pointers are (A) a related cell pointer in a diffusion cell to a contact layer cell, (B) a related cell pointer in a first metal layer cell to a via cell and (C) a related cell pointer in the via cell to a second metal layer cell. By following a chain of such related cell pointers, the compacting process can apply design rules that govern the spacing relationships of material regions on different mask levels. Typically, the specified design rules will specify a minimum overlap width requirement for related cells.

Boundary table 122 contains a linked list of four boundary items 160 for each cell 150. Each boundary item 160 includes an Adjacent Cell Pointer 162 to the cell on the other side of the boundary, an Edge Pointer 164 that points to an edge entry in the Edge Table 123, and a Next Pointer 166 that points to the next boundary item, if any, in the linked list of boundary items for a cell.

The Edge Table 123 contains data representing the edges referenced in the Boundary Table 122. Each edge 170 contains two pointers 172 and 174 to first and next points in the Point table 124. Each point 180 in the Point table 124 has X and Y coordinate values 182, 184, which represent the original X and Y coordinate values for that point before modification of the circuit layout by the compaction process, and a move value 186 which represents movement of the point in either the current direction of compaction (i.e., either the X or Y direction).

It is important to note that each edge 170 is typically referenced by two boundary items, since each edge is shared by two cells. In fact, due to the (maximal trapezoidal) method of fracturing the circuit layout before compaction is performed, all moveable (top and bottom) edges are shared by two cells. In addition, many points 180 in the point table 124 are shared by two to four edges, since two to four edges meet at many of the points in the fractured circuit layout.

The connectivity data structure 130 used by the present invention explicitly represents connectivity between cells by way of (A) the adjacent cell pointers in the boundary table 122 and (B) the related cell pointers 156 in the cell table 121. The connectivity data structure 130 also explicitly represents empty space with additional cells. Since all cell edges are linked to adjacent cells, connectivity and spacial relationships between neighboring circuit structures can be efficiently accessed or derived without having to search the entire circuit layout.

Cell list 125 is a sorted list of pointers to all the cells in the cell table 121, where the cells are sorted by their lowest X dimension value (without regard to the cell types of the various cells) during a first pass of the compaction process, and then are sorted by their lowest Y dimension value during a second pass of the compaction process. During the compaction process the cells in the layout are processed in the order identified in the cell list 125.

Figure 3:
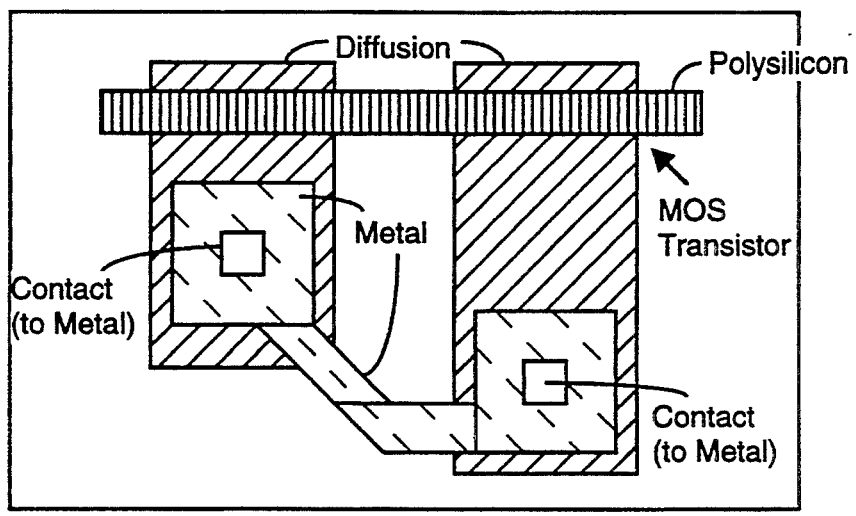
FIG. 3 depicts a small segment of a simple circuit layout.
Figure 4:
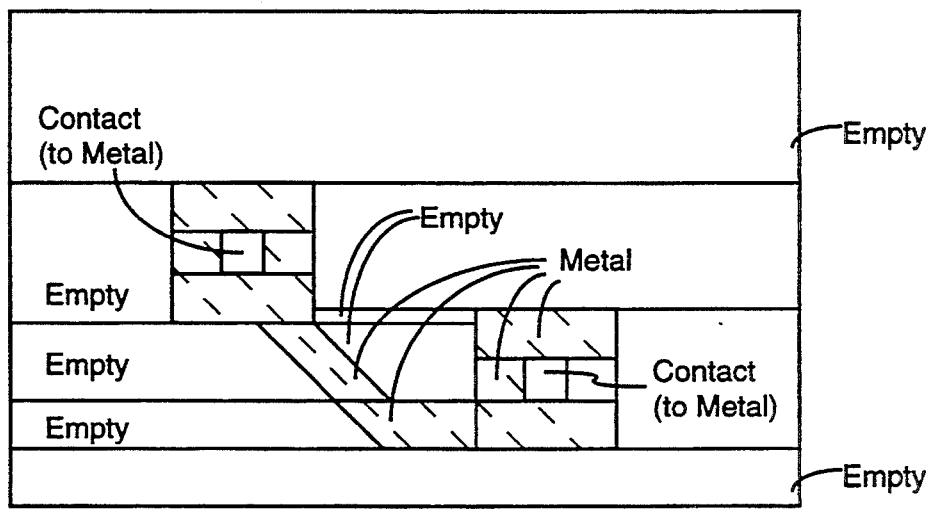
FIGS. 4 and 5 depict portions of the circuit layout of FIG. 3 after the layout has been fractured in the X dimension into maximal trapezoidal strips.
Figure 5:
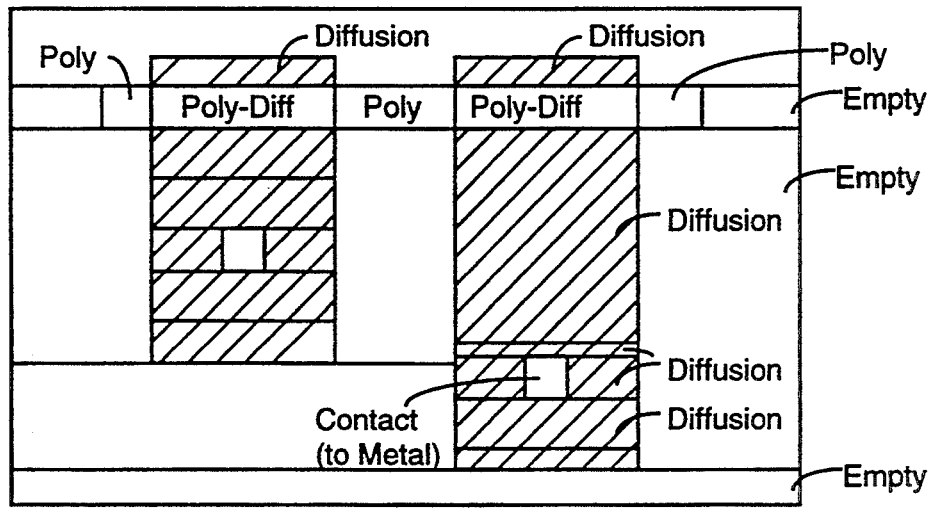

FIGS. 3, 4 and 5 show how the circuit layout in FIG. 3 is fractured using maximal horizontal trapezoidal strips into cells for each of the cell types, which are then stored in the connectivity data structure. When fracturing a circuit layout into maximal trapezoidal strips, additional lines are drawn in only one dimension to form trapezoid shaped cells. The dimension along which new lines are drawn is the dimension in which layout compression is to be performed. In FIG. 4, the non-shaded areas outside the metal regions represent empty cells. The non-shaded square areas inside the metal regions represent contacts from the metal regions to the underlying diffusion region. Note that the metal regions completely overlap the contacts despite the lack of shading in the contact regions in the Figures.

FIG. 5 shows an example of the five cells generated to represent an MOS transistor, formed by a polysilicon line crossing a diffusion region. In particular, there are two diffusion cells, one on either side of the polysilicon line, two polysilicon cells representing the portions of the polysilicon line not overlapping the diffusion region, and a "poly-diffusion" cell representing the area in which the polysilicon line overlaps the diffusion region. In this example, polysilicon cells, diffusion cells and poly-diffusion cells represent three types of cells whose spacing relationships are governed by a set of design rules.

Most design rules are applied to a set of three cells, generally representing a cell that may be compressed or expanded and the cells on either side of that cell. For example, a width design rule governing metal/contact region overlaps would be applied to the cell sequence "contact, metal, empty" and would define the minimum width of the metal region between the contact and empty cells.

Table 1 is a list of typical design rules. Each width design rule lists three cell types. "Compound: cell types represent overlapping structures, such as poly over diffusion, representing a transistor gate. Each spacing design rule lists only two cell types, with an implied "middle cell type" that is always of the type called "empty". Thus, even the spacing design rules always apply to a sequence of three cell types.

During processing of a circuit layout, every specified design rule is compared with the cell currently being processed, an all design rules applicable to that cell are applied. For instance, if the ray trace from one of the top or bottom edges of a cell detects that the adjacent cell is not empty, no spacing design rules will be applied to that edge, but various width design rules might be applicable.

Figure 6:
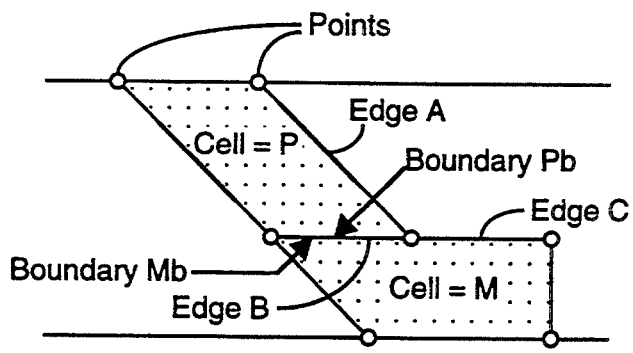
FIG. 6 depicts a small circuit layout and the portions thereof that are represented in the corresponding connectivity data structure.

FIG. 6 shows some of the connectivity data structure elements with respect to a trapezoidal cell and its neighbor.

An essential aspect of the connectivity data structure is that Cells share Edges, and Edges share Points. This sharing of Edges and Points is essential to the compaction methodology of the present invention, because the compaction process assigns move distances to edges and points of each cell that it processes. Thus, the Edges of neighboring cells, which share the moved Edge or edges, are automatically moved at the same time. When the Edges of a cell are assigned move distances, the compaction process checks the current move distances that may have already been assigned by an adjacent cell and then adjusts other edges of the cell, if necessary, so that all top edges of the cell move together rigidly and all bottom edges move together rigidly.

Figure 7:
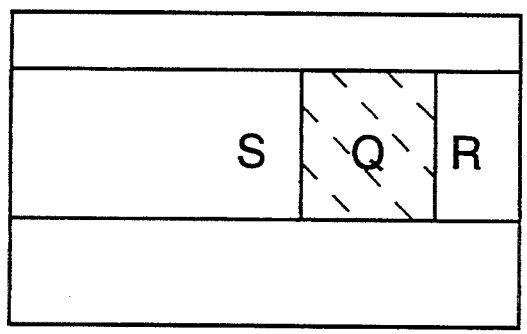
FIG. 7 represents a first circuit layout and FIG. 8 represents the circuit layout of FIG. 7 after one polygon has been added to it.
Figure 8:
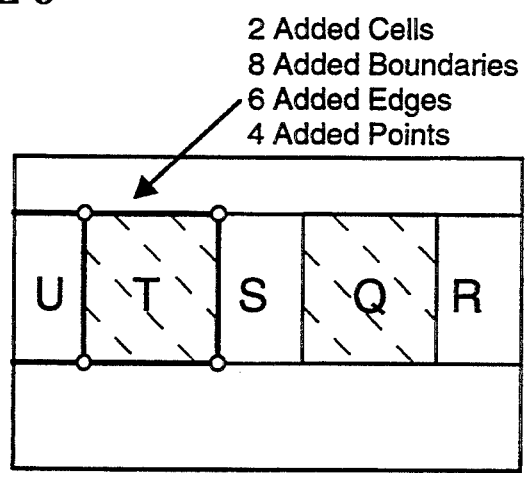

FIGS. 7 and 8 show the memory requirements for adding one rectangular cell to an existing layout. In particular, since each cell, boundary and point each requires the storage of three integers, and each edge requires the storage of two integers, the amount of added storage is 54 integers.

Figure 9A:
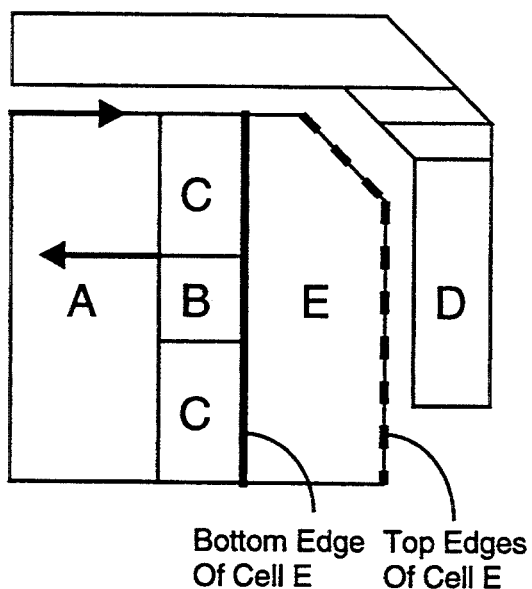
FIG. 9A represents a circuit layout to be compacted by the present invention.

FIG. 9A shows a small portion of a circuit layout, with all cells shown in FIG. 9A comprising metal layer cells, except for cell B which is a metal-to-diffusion contact cell. For compaction in the X direction, the bottom edge of cell E (shown by a wide line) is the edge with the smallest value of X, while the top edges of cell E (shown by a dashed line) are those with the largest values of X.

Ray Tracing Process

Rather than using a shadowing method to determine edge to edge constraints, the constraints are determined more simply and efficiently using a ray tracing process. The ray tracing process works by first creating a vector that is in the direction of compaction, begins at a point on the edge of a cell and ends at the maximum/minimum X or Y dimension of the cell. Edge intersections and cell transitions are successively calculated beginning at the cell that contains the beginning point of the ray. If the ray intersects a boundary of a cell, then a cell transition takes place. Then the current cell is changed to be the cell that is adjacent to the intersected boundary, and the process searches for the next ray-to-boundary intersection. The search terminates when a cell is encountered that meets a specified terminating condition.

The terminating condition depends on the type of search. There are two types of searches: a width search and a spacing search. Width searches are terminated when a cell is encountered that is not the same type as the beginning cell. The width search is used to determine minimum material widths, minimum material overlaps and in some cases minimum edge to edge spacing such as in the case of the spacing required between a diffusion contact and an MOS channel (edge to edge space between contact and polysilicon-diffusion regions).

Spacing searches, which are used to determine minimum spacing between disjoint cells such as metal to metal, are terminated when a cell of non-empty type is encountered.

Table 2 provides a more detailed description of the ray tracing process, in the form of pseudocode. Table 3 provides detailed pseudocode description of the layout compaction process. The pseudocode used in Tables 1 and 2 is, essentially, a computer language using universal computer language conventions. While the pseudocode employed here has been invented solely for the purposes of this description, it is designed to be easily understandable by any computer programmer skilled in the art. The computer programs in the preferred embodiment are written primarily in the Mainsail computer language, which is a product of Xidak Corporation, Palo Alto, Calif.

Compaction Process

Figure 14A:
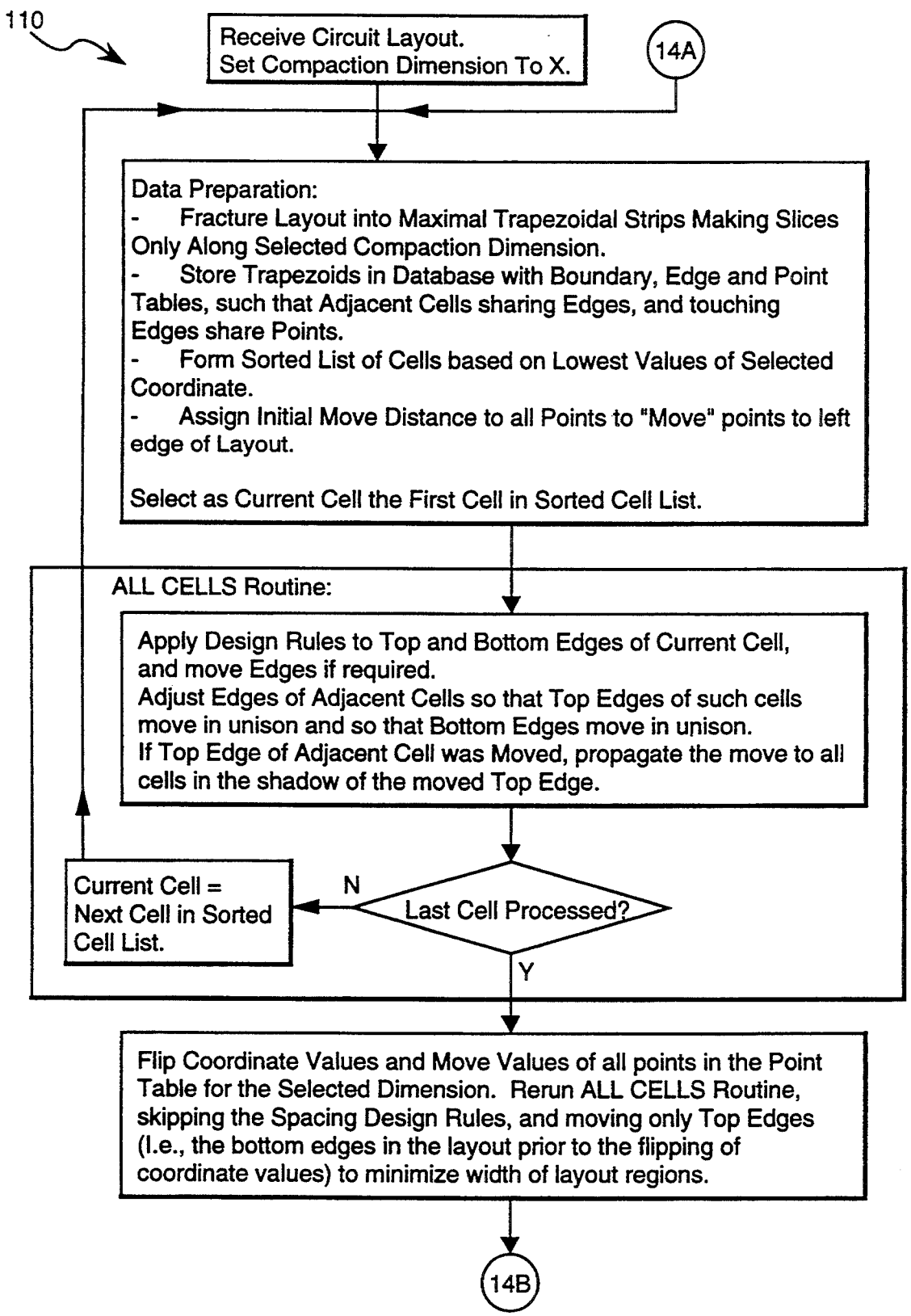
FIGS. 14A and 14B are flow charts of the circuit layout compaction process of the preferred embodiment.
Figure 14B:
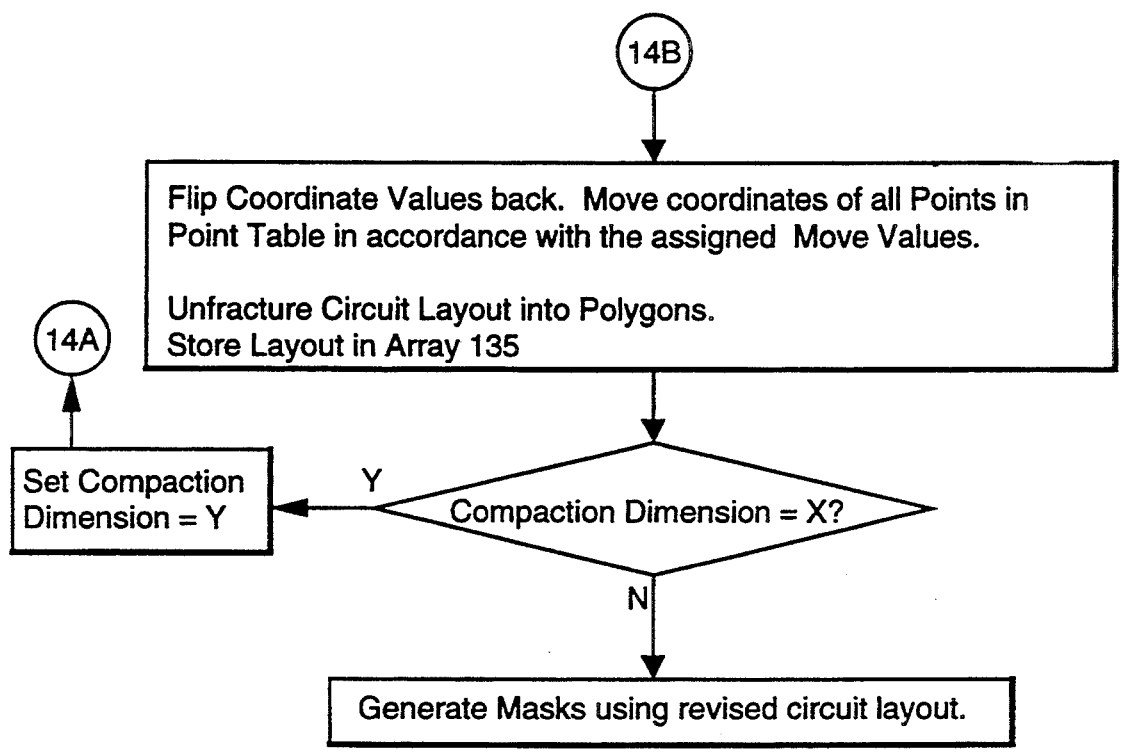

The following explanation is made with references to FIGS. 14A and 14B, and the pseudocode representation of the compaction process in Table 3. The automated circuit layout compaction process begins by fracturing a specified circuit layout into a maximal set of trapezoids (step 1 in Table 3) and then storing the resulting trapezoids in a connectivity data structure (step 2) that denotes the boundaries of each trapezoid cell, and the cell adjacent to each such boundary. As discussed above, empty spaces between cells are represented by additional empty cells. For each cell boundary, the connectivity data structure also stores data representing the beginning and end points of each boundary edge (line segment), as well as move data representing the distance by which each such edge has been moved. Neighboring cells on the same and related layers of the circuit layout share edges in the connectivity data structure, and edges share common points. As a result, when an edge or point of a cell is moved, the shared edge or point each neighboring cell is implicitly moved because it uses the same point data.

Next, the cells in the layout are sorted, based on the leftmost point of each cell when compacting the layout in the X dimension, and a list of pointers to the sorted cells is stored in the cell list 125 (step 3). To make sure that the layout is compacted as much as possible, all points in the point table are initially assigned a move distance that would move the point to the left edge (lowest coordinate value in the selected dimension) of the layout (step 4).

The compaction process is performed on one cell at a time, starting with the first cell in the list and then processing each succeeding cell in the list.

Before processing a cell, the move distances assigned to the cell's top and bottom edges are inspected and adjusted, if necessary, so that all top edges of the cell have the same move distance as the other top edges and so that all bottom edges of the cell have the same move distance as the other bottom edges. More particularly, the maximum move distance for all the top edges is assigned to the other top edges, and the maximum move distance for all the bottom edges is assigned to the other bottom edges (step 5.1).

To process a cell, the specified set of width and spacing design rules which are applicable to this cell (as determined by the cell's type) are applied to bottom edges of the cell, which may result in movement of the cell and adjustment of the cell's width (steps 5.2 and 5.3). Then the specified set of width and spacing design rules are applied to top edges of the cell (steps 5.4 and 5.5), which may result in further adjustment of the cell's width and movement of the cell.

FIG. 10A shows a situation in which a spacing design rule can be violated by two cell corners being too close, while FIG. 10B shows a situation in which a width design rule can be violated by boundaries of neighboring cells that are too close to each other. To catch such design rule violations and to move cells or edges to meet the requirements of the design rules, steps 5.2, 5.3, 5.4, and 5.5 are each repeated as "overscan steps" (see steps 5.2*b*, 5.3*b*, 5.4*b* and 5.5*b*) using a ray starting at an offset (or overscan) point when the edges being tested have an endpoint at an outer corner for spacing design rule tests, or an internal corner for width design rule tests.

Next (step 5.6), the edges of adjacent cells that were previously moved (i.e., earlier cells in the sorted list of cells) are adjusted, if necessary, so that all bottom edges of each affected cell have the same move distance, and so that all top edges of each affected cell have the same move distance. If a top edge is moved by the adjacent-cell-adjustment process, then the movement of the top edge is propagated to all cells in the shadow (with smaller values of the selected dimension) of the adjusted top edge (step 5.7). Furthermore, for all adjacent cells that were adjusted, the adjacent-cell-adjustment process is performed recursively until all previously processed cells have been adjusted (step 5.8). This process is repeated for all the non-empty cells in the layout.

Then (step 6), the coordinate values for the axis along which compression is being performed are flipped (e.g. setting all X coordinate values to −X), and the above compacting process is repeated for all non-empty cells in the layout, skipping the spacing design rules but applying the width design rules a second time to minimize feature widths. Step 6 is sometimes called "wire length minimization". Finally, all the edges in the circuit layout are moved by the previously assigned move distances (step 7).

The compaction process must be performed once for X-direction compaction and once for Y-direction compaction (steps 8 and 9). Then a new, revised circuit layout is generated from the data in the circuit layout database by converting the cells into the largest possible polygons, so as to produce a circuit layout with the minimum number of polygons. The revised layout is stored in array 135 (see FIG. 1). Finally, a set of masks is generated using the revised circuit layout (step 10 of Table 3).

Figure 9B:
FIG. 9B represents a revised version of one polygon in the circuit layout of FIG. 9A.

FIG. 9A represents an initial specified layout having cells labelled A, B, C, D and E. All cells shown are metal layer cells, except for metal-to-diffusion contact cell B. The direction of compaction is the horizontal X axis, and thus the cells are processed in an order based on their leftmost coordinate. As shown by FIG. 9B, when cell A is compared with a minimum width design rule, for example in this example, it is compressed, resulting in a cell with a smaller width than it previously had.

FIG. 11A shows the vectors used for ray tracing with respect to the B cell, for application of minimum width design rule checking. FIG. 11B shows that the width of cell B has been adjusted by the compaction process. Since cell B shares a common edge with cell C, cell C is also adjusted (by step 5.6 if cell C was previously processed).

FIG. 12A shows the scan forward my trace for cell E for minimum width checking, resulting in the top edge of cell E being moved. Also shown in FIG. 12A is the scan forward ray trace for minimum space checking, with this trace terminating at the bottom edge of cell D. A move distance is assigned to cell D based on this spacing check. The results of the processing of cell E are shown in FIG. 12B.

Figure 13A:
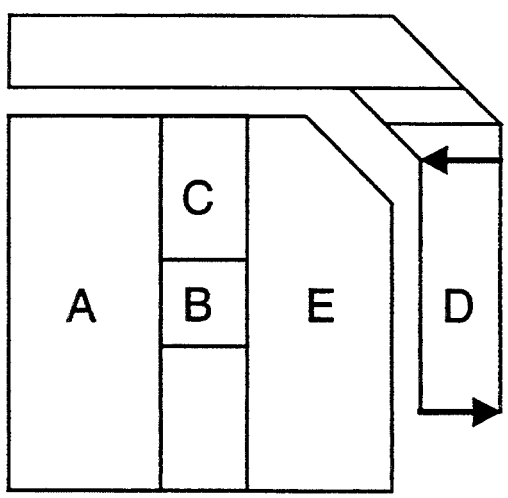
Figure 13B:
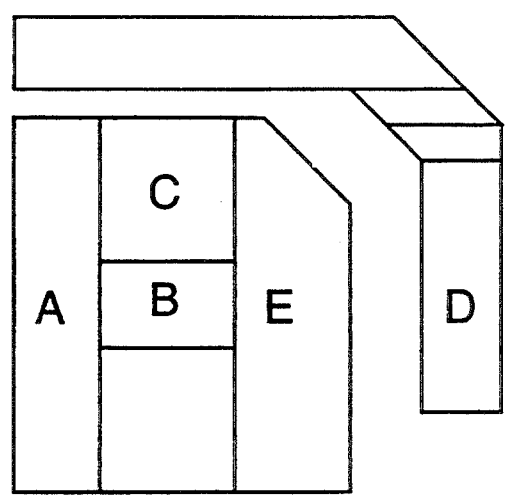

Finally, FIG. 13A shows scan forward and back ray traces for minimum width checking cell D, with FIG. 13B showing the result. Note that all points of cell D were assigned a move distance before the processing of cell D, and that any additional move distances generated by the processing of cell D are added to the previously assigned move distances for those points.

TABLE 1

EXAMPLES OF DESIGN RULES

WIDTH DESIGN RULES

| Cell-Type1 | Cell-Type2 | Cell-Type3 | Width (80 units = 1 micron) |
|---|---|---|---|
| empty | nwell | empty | 500 |
| empty | pwell | empty | 500 |
| empty | ndif | empty | 100 |
| empty | pdif | empty | 100 |
| empty | nwell | ndif | 340 |
| empty | nwell | pdif | 580 |
| empty | pwell | ndif | 580 |
| empty | poly | empty | 120 |
| pwell | nwell | ndif | 340 |
| nwell | pwell | ndif | 580 |
| empty | poly | ndif | 120 |
| empty | pdif | poly | 100 |
| empty | poly | pdif | 120 |
| empty | ndif | ndif-poly | 120 |
| empty | pdif | pdif-poly | 120 |
| empty | poly | ndif-poly | 120 |
| ndif | nidf-poly | ndif | 120 |
| empty | poly | pdif-poly | 120 |
| ndif | ndif-contact | ndif | 120 |
| pdif | pdif-contact | pdif | 120 |
| poly | ndif-poly | poly | 100 |
| empty | poly | poly-contact | 60 |
| empty | pdif | metal2-via | 0 |

SPACING DESIGN RULES

| Cell-Type1 | Cell-Type2 | Space |
|---|---|---|
| nwell | nwell | 1100 |
| ndif | ndif | 160 |
| pdif | pdif | 180 |
| pdif | ndif | 340 |
| poly | ndif | 60 |
| poly | pdif | 60 |
| poly | poly | 120 |
| ndif | ndif-poly | 0 |
| pdif | ndif-poly | 0 |
| ndif | pdif-poly | 0 |
| pdif | pdif-poly | 0 |
| metal | metal | 120 |
| metal2 | metal | 140 |

TABLE 2

PSEUDOCODE FOR RAY TRACING PROCESS

1. Receive Inputs to Search Routine:
   Cell Pointer:   Cell from which ray trace starts
   XS,YS:          Starting Point from which search
                   is performed.
   SrchDrctn:      Direction in which to search,
                   selected from the set
                   +X, −X, +Y and −Y.
   SrchType:       WIDTH or SPACING
   CurrentCell = Cell identified by Cell Pointer.
   BeginCell.Type = Type of Current Cell
2. For WIDTH SEARCH DO: {
3. Inspect boundaries of Current Cell and locate the boundary
   of the Current
   Cell that intersects the specified ray.
   Set Bndry = top/bottom boundary which intersects ray
   Set P = point at which ray intersection occurs
   NextCell = Bndry's Adjacent Cell.
   NextType = Type of NextCell TABLE 2-continued

PSEUDOCODE FOR RAY TRACING PROCESS

-- Note that if NextCell = end of layout, NextType = 0
4. If NextType = BeginCell.Type {
   -- Perform Cell Transition and then Repeat step 3
       Current Cell = NextCell
       Go back to Step 3.
   }
5. Return (P, Bndry) }
   End WIDTH SEARCH }
6. For SPACING SEARCH DO: {
7. If CornerCheck is being performed {Jump to Step 8}
   -- CornerCheck Spacing Search ray trace must start
   in Empty Cell.
   -- For Regular Space Search, Check that Neighboring
   Cell is Empty
   -- If Neighboring cell is not empty, no spacing search
   can be performed
   -- for this cell in the specified direction.
   P = point XS,YS
   Bndry = Top/Bottom boundary that contains point P
   NextCell = Bndry's Adjacent Cell.
   NextCell.Type = Type of NextCell
   If NextCell.Type ≠ Empty: { Return (0, 0) }
8. Inspect boundaries of Current Cell and locate the boundary
   of the Current
   Cell that intersects the specified ray.
   Set Bndry = top/bottom boundary which intersects ray
   Set P = point at which ray intersection occurs
   NextCell = Boundary's Adjacent Cell.
   NextCell.Type = Type of NextCell
9. If NextCell.Type = Empty, repeat step 8.
10. Return (P, Bndry, NextCell)
    End SPACING SEARCH }

TABLE 3

PSEUDOCODE FOR COMPACTION PROCESS

-- Data Preparation Steps
0.  Set Compaction Dimension to X:
    -- Top Edges of each cell are those with largest X values.
    -- Bottom Edges are those with smallest X values.
1.  Fracture specified layout into maximal trapezoidal strips
    (making new slices
    or lines only along the selected dimension).
2.  Stored layout in the Connectivity data structure using
    cells corresponding
    to the trapezoidal strips.
3.  Combine all occupied (non-empty) cells from all layers
    into a linked list
    and sort this list based on the lower left corner of each
    cell (i.e., sort by
    lowest X value when the compaction dimension is X,
    and sort by lowest
    Y value when the compaction dimension is Y).
4.  For every point in the point table, assign an initial
    move distance that
    would move the point to the left edge (lowest coordinate
    value in the
    selected dimension) of the layout.
-- All Cells Routine
ALL CELLS: FOR ALL cells in the sorted cell list DO:
-- Process cells in the order found in the sorted cell list.
5.1 For each bottom edge of the cell, set the assigned move
    distance to be
    the maximum move distance of all bottom edges for the cell.
    For each
    top edge, set the assigned move distance to be the
    maximum move
    distance of all top edges for the cell. This normalizes the cell
    since all
    top edges and bottom edges must move rigidly and all bottom
    edges must move rigidly.
BottomEdge: For all Bottom Edges of the Current Cell DO:
5.2 Apply Spacing Design Rules:
5.2a Use the ray tracing routine to search Backwards for any
    edge to
    edge Spacing constraints, and assign appropriate
    move distances,
    if necessary, to move the cell.
5.2b For External Corner Points, use the ray tracing

TABLE 3-continued
PSEUDOCODE FOR COMPACTION PROCESS

```
        routine to search
        Backwards for any corner to corner Spacing
          constraints starting
        at point, using ray starting at offset point,
          and assign appropriate
        move distances, if necessary, to move the cell.
  5.3   Apply Width Design Rules:
  5.3a  Use the ray tracing routine to search Backwards
          and Forwards for
        any edge to edge Width constraints, and assign
          appropriate move
        distances, if necessary, to adjust the width of the cell.
  5.3b  For Internal Corner Points, use the ray tracing
          routine to search,
        starting at offset point for top edge of neighboring
          cell, and assign
        appropriate move distances, if necessary,
        to adjust the width of the cell.
End BottomEdge
TopEdge: For all Top Edges of the Current Cell DO:
  5.4   Apply Width Design Rules:
  5.4a  Use the ray tracing routine to search Backwards
          and Forwards for
        any edge to edge Width constraints, and assign
          appropriate move
        distances, if necessary, to adjust the width of the cell.
  5.4b  For Internal Corner Points, use the ray tracing
          routine to search,
        starting at offset point for bottom edge of
          neighboring cell, and
        assign appropriate move distances, if necessary,
        to adjust the width of the cell.
  5.5   Apply Spacing Design Rules:
  5.5a  Use the ray tracing routine to search Forwards
          for any edge to
        edge Spacing constraints, and assign appropriate
          move distances,
        if necessary, to move the cell.
  5.5b  For External Corner Points, use the ray tracing
          routine to search
        Forwards for any corner to corner Spacing
          constraints starting at
        point, using ray starting at offset point, and assign appropriate
        move distances, if necessary, to move the cell.
End TopEdge
  5.6   Adjust edges in adjacent cells that were
          previously moved (i.e.,
        earlier cells in the linked list of cells) so that all
          bottom edges of
        such cells have the same move distance,
          and so that all top edges
        of such cells have the same move distance.
  5.7   If a top edge was moved by the adjacent-cell-
          adjustment process
        of 5.6, then propagate the move to all cells
          in the shadow (with
        smaller value of selected dimension) of the top edge.
  5.8   For all adjacent cells that were adjusted, recursively
          do steps 5.6
        and 5.7 for all the adjacent cells of the adjacent cells.
End ALL CELLS
  6.    Flip coordinate values (and move values) of all points
          in the point table
        for the axis along which the circuit layout is being
          compressed. Rerun
        the ALL CELLS routine, skipping the Spacing constraint
          Rule steps (this
        performs "wire length minimization").
        – During this second pass, the "bottom edges"
          which were the top
        edges in the prior pass) of cells are not adjusted.
          Only the top
        edges of cells are moved, when necessary,
          to minimized width of
        the various layout regions.
  7.    Flip coordinate values (and move values) of all points
          in the point table
        for the axis along which the circuit layout is being
          compressed. Move
        the coordinates of each edge by the assigned move
          distance in the Points
        Table.
– REPEAT FOR OTHER DIMENSION:
  8.    Unfracture the layout into polygons to prepare for re-
          fracturing in the Y
          direction.
  9.    Set Compaction Dimension to Y:
        – Top Edges of each cell are those with largest Y values.
        – Bottom Edges are those with smallest Y values.
        Repeat steps 1–8.
  10.   Generate Photolithography Masks using revised circuit layout.
```

ALTERNATE EMBODIMENTS

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. In particular, the exact manner in which the layout data is stored is not important, so long as the data for each cell ha the required links to its related and adjacent cells, and as long as the data representing shared boundary edges is similarly shared. Similarly, the exact manner in which design rules are applied to each cell could probably be varied without changing the aspects of the present that make it computationally efficient.

What is claimed is:

1. A method of revising a multilayer integrated circuit layout in accordance with a specified set of design rules, the steps of the method comprising:

receiving data representing said integrated circuit layout, and storing said integrated circuit layout in a database which represents said integrated circuit layout as a set of cells, each cell representing a region of an identified layer of said integrated circuit layout;

storing in said database cells representing all empty spaces between non-empty regions of each layer of said integrated circuit layout;

storing in said database a representation of each boundary of each cell, each said boundary representation including adjacent cell data indicating which other cell is adjacent said each boundary;

for each boundary representation in said database, storing edge data representing said boundary's endpoints, and storing a pointer in said boundary representation to said edge data, wherein the boundary representations of adjacent cells for boundaries that have identical endpoints point to identical edge data in said database; and adjusting, in accordance with a predefined set of design rules, said edge data in said database so as to adjust said cells' positions and sizes; wherein each adjustment of said edge data for one boundary of one cell automatically adjusts a corresponding boundary of said other cell adjacent to said one boundary by way of their shared edge data in said database.

2. The method of claim 1 wherein said adjusting step includes (A) selecting a cell from said database to process, and identifying said selected cell's top and bottom boundaries;

(B) comparing said top and bottom boundaries of said selected cell with those of said predefined design rules that are applicable to the layout layer on which said selected cell is located and moving said top and bottom boundaries as required to meet each of said applicable predefined design rules by assigning move distances to said edge data corresponding to said top and bottom boundaries; and repeating said steps A and B for a sequence of cells in said database.

3. The method of claim 2 wherein;

each said predefined design rule includes a length value;

said comparing step includes, whenever required by one of said predefined design rules, tracing a line through a cell adjacent to one of said top and bottom boundaries of said selected cell; and said tracing step includes accessing the cell adjacent to said one boundary of said selected cell using said adjacent cell data in said boundary representation of said one boundary, locating a distal edge on said adjacent cell's boundary, computing the distance between said selected cell's boundary and the located distal edge, and comparing the computed distance with said design rule's length value.

4. The method of claim 3, wherein said tracing step is repeated recursively on successively adjacent cells in a specified direction until a cell meeting criteria specified by said design rule is located.

5. A computer aided design system for revising a multilayer integrated circuit layout, comprising:

data receiving means for receiving data representing said integrated circuit layout;

a design rule dictionary representing a set of design rules;

a circuit layout database including:

a cell table representing cells, each cell representing a region of an identified layer of said integrated circuit layout, said cell table including cells representing all empty spaces between nonempty regions of each layer of said integrated circuit layout;

edge data representing all edges of all said cells in said cell table, said edge data including point data representing each edge's endpoints such that each point which is an edge endpoint of two or more edges is represented by a single, shared point datum; each said point datum representing a point location and a move value indicating movement of an edge's endpoint;

adjacent cell data indicating adjacent cell data indicating, for each edge of each cell, which other cell is adjacent said cell at said edge;

circuit layout compaction means for adjusting, in accordance with said design rules represented by said design rule dictionary, said point data in said database so as to adjust said cells' positions and sizes; wherein each adjustment of said point data for one edge of one cell automatically adjusts a corresponding edge of said other cell adjacent to said one edge by way of their shared point data in said database; and revised circuit layout generation means for generating a revised circuit layout in accordance with said adjusted point data in said database.

6. The computer aided design system of claim 5 wherein said circuit layout compaction means includes:

(A) cell selection means for selecting cells from said database to process in a specified sequence, and for identifying each selected cell's top and bottom edges; and (B) design rule application means for comparing said top and bottom edges of each said selected cell with those of said predefined design rules that are applicable to the layout layer on which said each selected cell is located and moving said top and bottom edges as required to meet each of said applicable predefined design rules by assigning move distances to said edge data corresponding to said top and bottom edges.

7. The computer aided design system of claim 6 wherein;

each design rule in said dictionary includes a length value;

said design rule application means, whenever required by one of said design rules, locates the cell adjacent to said one edge of said each selected cell using said adjacent cell data, locates a distal edge of said adjacent cell, computes the distance between said selected cell's one edge and the located distal edge, and compares the computed distance with said design rule's length value.

8. The computer aided design system of claim 7, wherein design rule application means recursively locates successively adjacent cells in a specified direction until a cell meeting criteria specified by said design rule is located.

* * * * *